United States Patent [19]

Kitou et al.

[11] Patent Number: 4,956,587
[45] Date of Patent: Sep. 11, 1990

[54] HORIZONTAL DEFLECTION-HIGH VOLTAGE CIRCUIT

[75] Inventors: Kouji Kitou; Makoto Onozawa, both of Yokohama, Japan

[73] Assignee: Hitachi, Ltd., Tokyo, Japan

[21] Appl. No.: 301,531

[22] Filed: Jan. 26, 1989

Related U.S. Application Data

[63] Continuation-in-part of Ser. No. 204,288, Jun. 9, 1988.

[30] Foreign Application Priority Data

Jan. 29, 1988 [JP] Japan ................... 63-17006

[51] Int. Cl.⁵ .................... H01J 29/70; H01J 29/76
[52] U.S. Cl. .................... 315/408; 315/411
[58] Field of Search ................... 315/408, 411

[56] References Cited

U.S. PATENT DOCUMENTS

| | | |
|---|---|---|
| 204,288 | 6/1988 | Kitou et al. |
| 4,242,714 | 12/1980 | Yoshida et al. ........ 315/408 |
| 4,728,868 | 3/1988 | Ishikawa et al. ........ 315/411 |
| 4,733,141 | 3/1988 | Watanuki ........ 315/408 |

Primary Examiner—Theodore M. Blum
Attorney, Agent, or Firm—Fay, Sharpe, Beall, Fagan, Minnich & McKee

[57] ABSTRACT

A source-voltage controlling high voltage stabilizer for detecting the high voltage and controlling the source voltage, while providing a detector detecting the envelope of a horizontal deflection current, wherein the deflection current is stabilized as the voltage distribution of two scanning capacitors in a diode modulation type output stage and is so controlled that a coincidence is attained between the wave form of the output signal and that of the horizontal deflection current modulation signal. The source voltage supplied to the input side of the flyback transformer is controlled in such a manner that the high voltage obtained from the output side of the flyback transformer is maintained constant, and the circuit further has a variation detector for detecting the variation in the source voltage, wherein the detected variation component is applied to one of the junctions of the modulation coil.

14 Claims, 13 Drawing Sheets

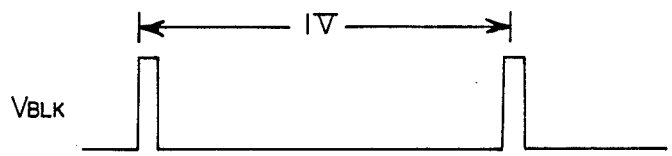
FIG. 7(a) V_BLK
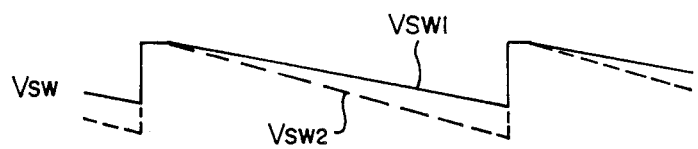
FIG. 7(b) V_SW
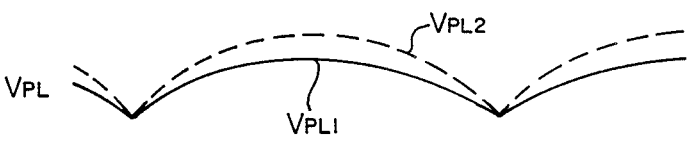
FIG. 7(c) V_PL
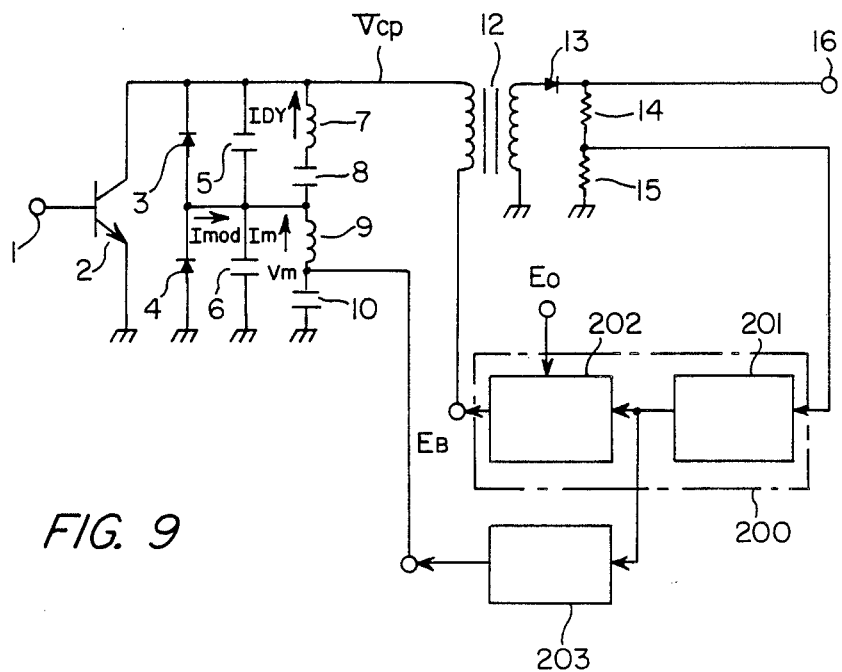
FIG. 9

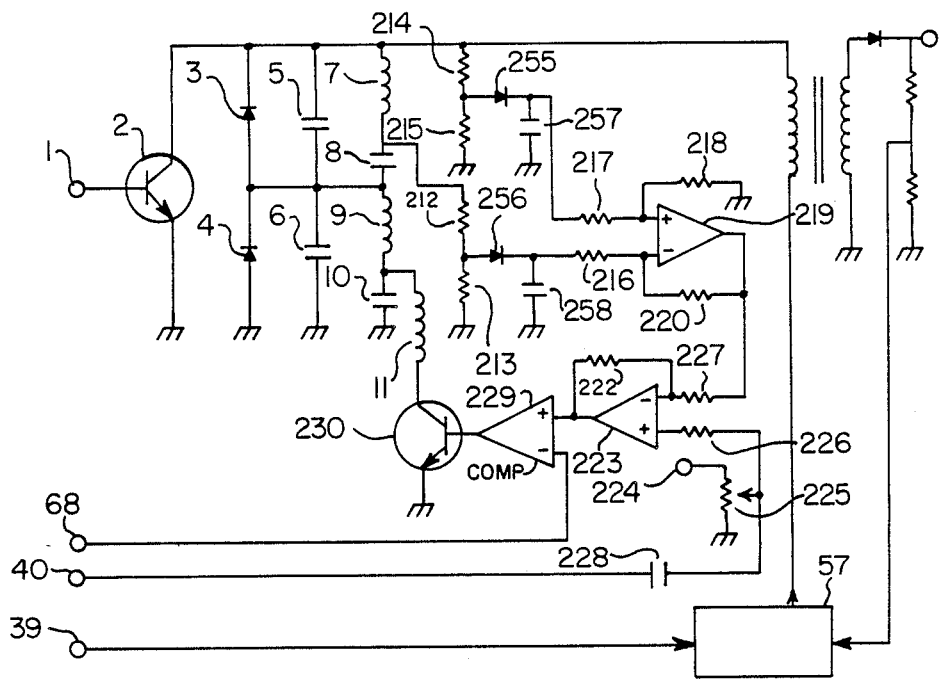
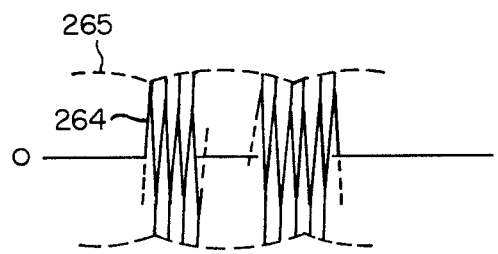
FIG. 15
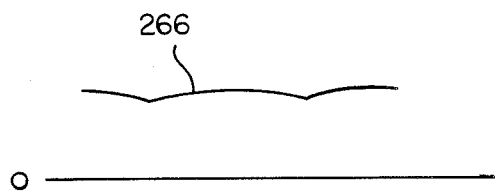
FIG. 16(a)
FIG. 16(b)

HORIZONTAL DEFLECTION-HIGH VOLTAGE CIRCUIT

The present application is a continuation-in-part of Ser. No. 204,288, filed June 9, 1988 and entitled HORIZONTAL DEFLECTION HIGH-VOLTAGE CIRCUIT.

BACKGROUND OF THE INVENTION

The present invention relates to horizontal deflection-high voltage circuits. In conventional circuits of this type, particularly when designed for display units that require high image quality, for example for use with a computer system and the like, the horizontal deflection circuit and the high voltage circuit are formed separately from each other.

An example of a composite construction of the horizontal deflection and high voltage circuits is disclosed in Japanese Patent Laid-Open No. 58(1983)-138179.

SUMMARY

The present invention is an object to overcome the disadvantages of the conventional structure, described hereinafter. It is an object to provide an improved composite horizontal deflection-high voltage circuit which requires no adjustment and is kept free from deterioration of the performance that may otherwise be induced by some adjustment dispersion or secular change.

These and other objects can be achieved by providing a source-voltage controlling high voltage stabilizer for detecting the high voltage and controlling the source voltage, while providing a detector detecting the envelope of a horizontal deflection current, wherein the deflection current is stabilized as the voltage distribution of two scanning capacitors in a diode modulation type output stage and is so controlled that a coincidence is attained between the wave form of the output signal and that of the horizontal deflection current modulation signal.

The source voltage supplied to the input side of the flyback transformer is controlled in such a manner that the high voltage obtained from the output side of the flyback transformer is maintained constant, and the circuit further has a variation detector for detecting the variation in the source voltage, wherein the detected variation component is applied to one of the junctions of the modulation coil.

In the present invention, any variation component in the source voltage supplied to the input side of the flyback transformer and any change in accordance with a high voltage variation can be detected directly by the variation detector with a gain set to unity. The detected variation component is applied to one of the junctions at the tWo ends of modulation coil to maintain constant the voltage across the first scanning capacitor connected in series to the horizontal deflection coil. In this circuit configuration the horizontal deflection current floWing in the horizontal deflection coil can be retained with stability despite any variation caused in the source voltage. Furthermore, due to the lack of necessity of any adjustment of a variable resistor or the like that has been conventionally employed, With the present invention it becomes impossible to avert increase of the adjustment time as well as to prevent deterioration of the performance that may otherwise be induced by some adjustment dispersion and secular change.

The source-voltage control type high voltage stabilizer detects the high voltage through resistance division, then compares the detected voltage with a reference voltage and controls the source voltage in a manner to minimize the differential error between the compared voltages, thereby maintaining the high voltage output at a constant value. Meanwhile, the detection current envelope detector rectifies and smoothes the voltage across the scanning capacitor connected in series to the deflection coil or the secondary voltage of the current transformer connected in series to the deflection coil, thereby detecting the current envelope. The output signal of the envelope detector and the horizontal deflection current modulation signal are inputted to a pulse-width modulating voltage controller comprising an error amplifier, comparator, switching transistor and a smoothing coil, and the output of such voltage controller is connected to one of the two scanning capacitors in the diode modulation type output state, whereby the voltage distribution of the two scanning capacitors is controlled to automatically attain a coincidence between the wave form of the output signal of the envelope detector and that of the horizontal deflection current modulation signal, hence realizing the object of the present invention in not requiring adjustment and in preventing deterioration of the circuit performance that may be derived otherwise from some adjustment dispersion or secular change.

BRIEF DESCRIPTION OF THE DRAWINGS

Further features, objects and advantages of the present invention will become more clear from the following detailed description of a preferred embodiment, as shown in the accompanying drawings, wherein:

FIG. 7 is a timing chart showing wave forms of signals in the principal part of FIG. 6;

FIG. 9 is a block diagram useful in explaining the structure and function of a typical conventional horizontal deflection-high voltage circuit;

FIG. 15 is a variation of the circuit according to FIG. 12;

FIG. 16 is a wave form chart useful for explaining the operation of the present invention;

DETAILED DESCRIPTION

Figure 1:
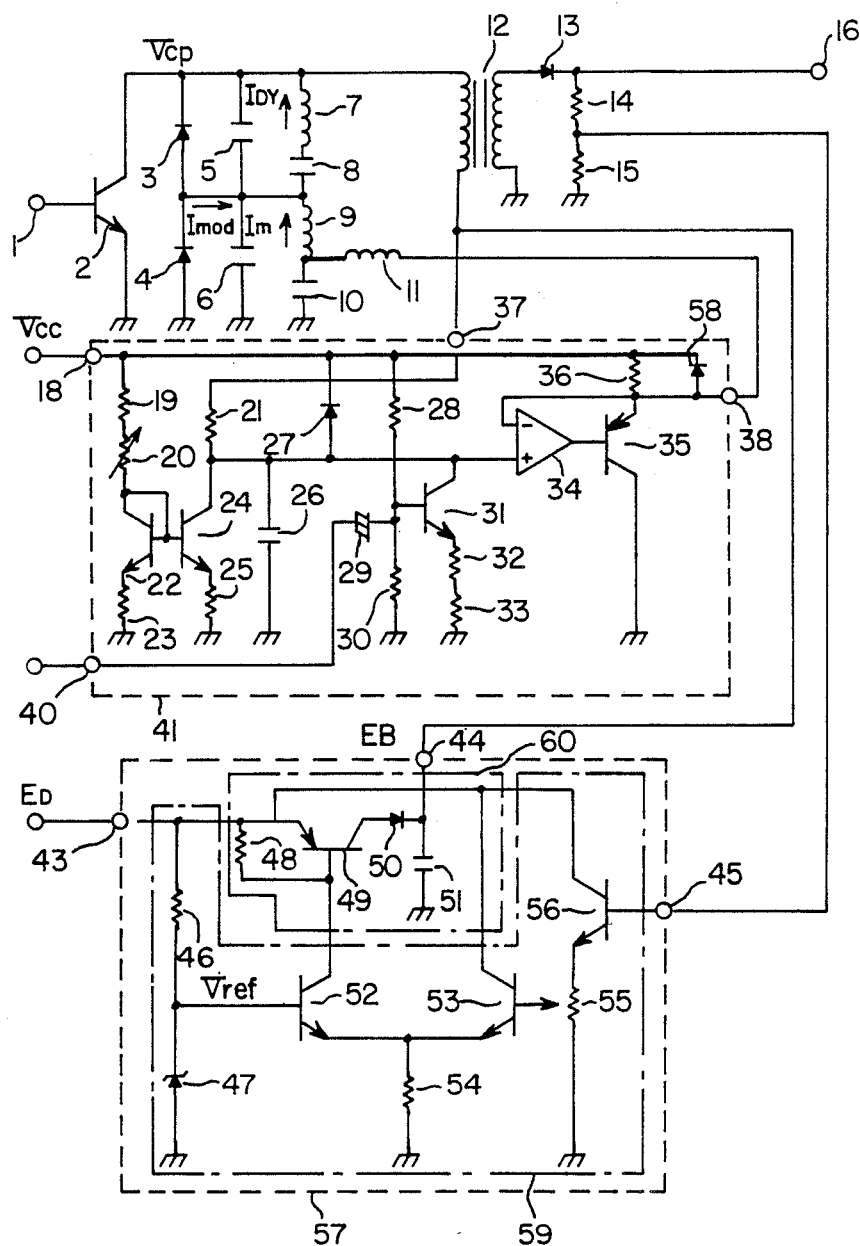
FIG. 1 is a circuit diagram of a broad embodiment.

FIG. 9 is useful for explaining the inventors analysis of the above-mentioned known type of composite circuit having the horizontal deflection and high voltage circuits, with FIG. 9 being a block diagram.

In FIG. 9, a horizontal drive pulse is provided to input terminal 1 feeding the base of horizontal output transistor having its collector connected directly to first damper diode 3 that is connected in series with second damper diode 4 leading to ground, with the ground being common to the emitter of output transistor 2. A first resonance capacitor 5 is connected in parallel with first ampere diode 4, and a second resonance capacitor 6 is connected in parallel with second damper diode 4. A horizontal deflection coil 7 in series with a first scanning capacitor 8 are connected in parallel with the first resonance capacitor 5; a modulation coil 9 in series with a second scanning capacitor 10 are connected in parallel with the second resonance capacitor 6. One terminal of the secondary of fly back transformer 12 is connected to a high voltage rectifier diode 13 leading to high voltage output terminal 16. From a connection between the rectifier diode 13 and high voltage output terminal 16, high voltage division resistors 14 and 15 are connected to ground, to provide a voltage divider circuit provided with a voltage division output lead as an input to the voltage stabilizer circuit 200. The voltage stabilizer circuit 200 has a high voltage variation detector 201, receiving the voltage division signal and a source voltage controller 202 receiving the output from the high voltage variation detector 201. Also, horizontal deflection current controller 203 receives the output from the high voltage variation detector 201, to provide its output between modulation coil 9 and capacitor 10. Further, a DC voltage $E_O$ is applied as an input to the source voltage controller 202. The high-voltage controlling voltage $E_B$, the output of controller 202, is applied to one terminal of the primary of the flyback transformer 12 to constitute the source voltage of the horizontal deflection-high voltage circuit, with the other terminal of primary having voltage $V_{CP}$ directly connected to the collector of transistor 2.

In FIG. 9, the resonance frequency of the resonance capacitor 5 with the horizontal deflection coil 7 is set to be substantially equal to the resonance frequency of the resonance capacitor 6 with the modulation coil 9, and these two resonance circuits are connected in series to each other. Hereinafter, the horizontal deflection output circuit of this construction will be referred to as a diode modulation type output state.

In the diode modulation type output stage, the operation is performed in the following manner. In FIG. 9, current $I_{DY}$ is the peak-to-peak value of the current flowing in the horizontal deflection coil 7, Im is the peak-to-peak value of the current flowing in the modulation coil 9, and Imod is the peak-to-peak value of the current flowing from the junction of the first damper diode 3 and the second damper diode 4 to the junction of the first scanning capacitor 8 and the modulation coil 9. Such current values are graphically represented in FIG. 10 as the functions of the voltage Vm across the second scanning capacitor 10.

Figure 10:
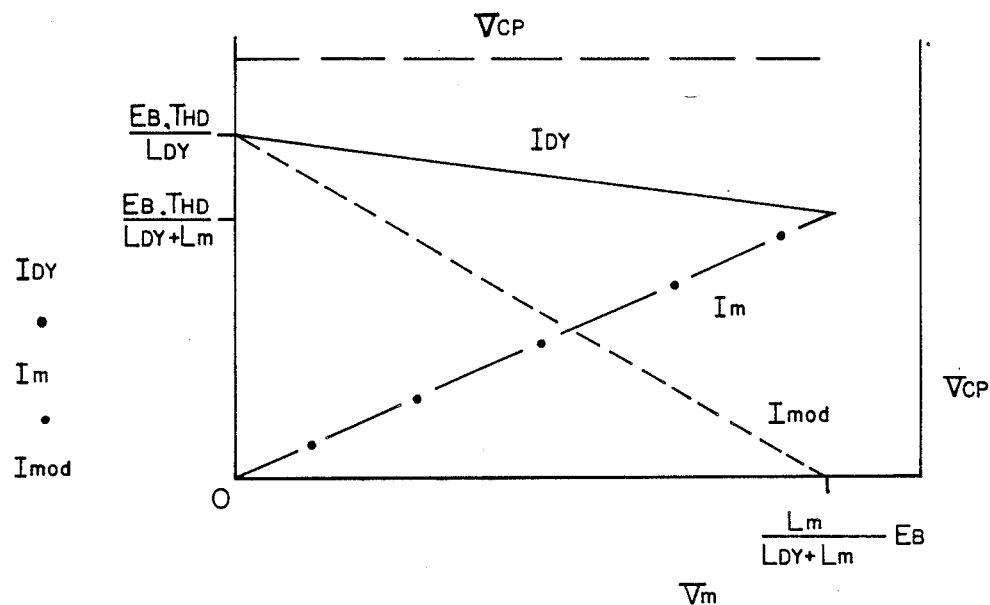
FIG. 10 graphically represents the operation of a diode modulation type output state in the circuit of FIG. 9.

In FIG. 10, there are: $E_B$, the output voltage, that is the high-voltage controlling voltage, of the high voltage stabilizer 200; LM for the inductance of the modulation coil 9; $T_{HD}$ for the horizontal scanning interval; and Vcp is the maximum collector voltage of the horizontal output transistor 2. It is observed from the graphical representation of FIG. 10 that the horizontal deflection current $I_{DY}$ can be changed by the modulation voltage Vm, whereas the maximum collector voltage Vcp remains unchanged in the high-voltage controlling voltage $E_B$ is kept constant.

The high voltage stabilizer 200 in FIG. 9 is a source-voltage control type circuit, wherein the voltage across the high voltage division resistor 15 is the input, and the high voltage variation (error) is detected therefrom by the high voltage variation detector 201. The source voltage (high-voltage controlling voltage) $E_B$ obtained from the Dc voltage $E_O$ is changed by the source voltage controller 202 in accordance with the detected output of high voltage variation detector 201, whereby the high voltage is maintained constant. Therefore, in such source-voltage control type high voltage stabilizer 200, a change occurs in the horizontal deflection current $I_{DY}$ in accordance with the variation caused by the high-voltage controlling voltage $E_B$ due to the difference of the beam current Ib.

Figure 11:
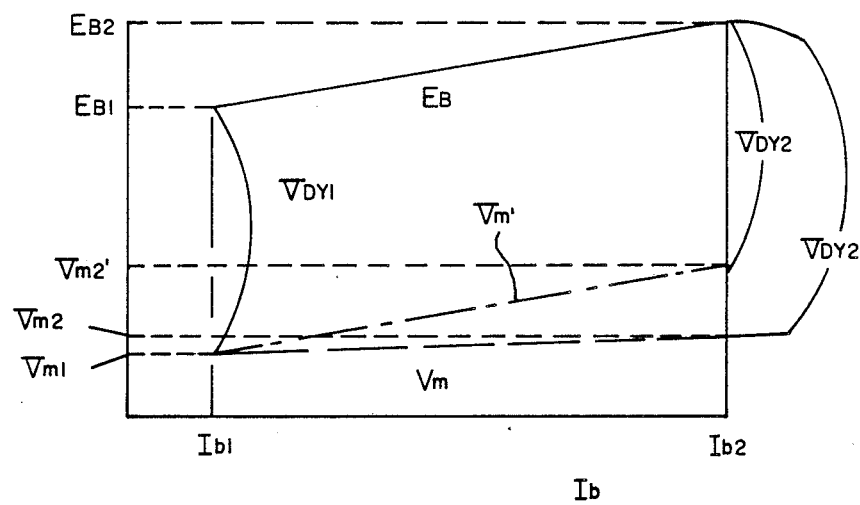
FIG. 11 graphically shows how a horizontal deflection current $I_{DY}$ is changed in accordance with variation of a high-voltage controlling voltage $E_B$ with respect to the circuit of FIG. 9.

This phenomena will now be described below with reference to FIG. 11. As shown in the graph of FIG. 11, when the beam current Ib is increased from Ib1 to Ib2, the high-voltage controlling voltage $E_B$ is raised from $EB_1$ to $EB_2$ for maintaining the high voltage constant. In this case, the voltage $V_{DY}$ across the first scanning capacitor 9 is changed from $V_{DY1}$ to $V_{DY2}$, while the voltage Vm across the second scanning capacitor 10 is changed from Vm1 to Vm2. Such voltage changes are due to the relationship expressed in equations 1-3, below:

$$E_{B1} = V_{DY1} + Vm1 \quad (1)$$

$$E_{B2} = V_{DY2} + Vm2 \quad (2)$$

$$Vm1/E_{B1} = Vm2/E_{B2} \quad (3)$$

A change is induced in the horizontal deflection current $I_{DY}$, since it is proportional to the voltage $V_{DY}$. Therefore, in the conventional example of FIG. 9, the detected output (high voltage variation) from the high voltage variation detector 201 is inputted to the horizontal deflection current controller 203 where the detected output is adjusted, and subsequently the modulation voltage Vm is superposed thereon to maintain constant the voltage $V_{DY}$ across the first scanning capacitor 9. In this operation, the modulation voltage Vm is changed to Vm' shown in FIG. 11. As a result, the capacitor voltage is retained as $V_{DY2'} = V_{DY1}$ in FIG. 11, so that the horizontal deflection current $I_{DY}$ can be kept constant despite any change in the high voltage controlling voltage $E_B$.

There are problems with the circuit discussed with respect to FIGS. 9–11. In the above conventional example, as mentioned, the voltage (Vm'−Vm) to be superposed on the modulation voltage Vm (voltage across the second scanning capacitor 10) is obtained from the detected output (that is high voltage variation) of the high-voltage variation detector 201. For such purpose, it is necessary in the horizontal deflection current controller 203 to adjust the output of the high voltage variation detector 201 by means of a variable resistor or the like. However, in this known example, no consideration is given with regard to the concomitant increase of the adjustment time or to deterioration of the performance derived from adjustment dispersion and secular change.

With respect to circuits having the horizontal deflection circuit formed separately from the high voltage circuit, there is the disadvantage of requiring an enlarged scale for the circuit configuration and increased production cost. In view of such circumstances, studies and developments have been in progress for realizing an improvement consisting of both the horizontal deflection circuit and the high voltage circuit formed integrally with each other in a single integrated circuit, while still retaining satisfactory performance equivalent to that of the known separate.

With the above noted specific circuit of FIGS. 9–11, a horizontal deflection circuit is formed into a diode modulation type where two resonant circuits are connected in series, and any high-voltage load variation is corrected by changing the source voltage supply to a flyback transformer, while any deflection current variation resulting therefrom is corrected by changing the voltage of one of the scanning capacitors of the two resonant circuits in the same direction as the source voltage. However, since some adjustment is required for correction of the deflection current variation, it causes increase of the adjustment time, and there has been given no consideration thereto to deterioration of the performance derived from the adjustment dispersion and the secular change, as mentioned above.

Throughout the description of the figures, like reference numerals will be applied to like parts and where once described, their description will not necessarily be repeated.

A circuit constructed according to the present invention is shown in FIG. 1. Elements 1, 2, 3, 4, 5, 6, 7, 8, 9, 10, 12, 13, 14, 15, 16 have been described previously with respect to FIG. 9. A DC voltage Vcc is provided to input terminal 18; a vertical parabolic voltage is provided to input terminal 40; a DC voltage $E_O$ is provided to input terminal 43; a high voltage control voltage $E_B$ is provided at output terminal 44; a high voltage detection voltage is provided at input terminal 45 from the voltage division 14, 15; a high voltage control voltage $E_B$ is provided to the input terminal 37; and a modulation voltage is provided at output terminal 38. A horizontal deflection control circuit 41 is defined by the elements within the associated dashed lines, and has terminals 18, 40, 38 and 37. A high voltage stabilizer circuit 57, defined as the elements within the associated dashed lines is provided with the terminals 43, 44 and 45; the circuit may be the same as shown in U.S. Pat. No. 4,649,465 issued Mar. 10, 1987. Within this circuit is a high voltage variation detector 59 shown by the associated chain lines and a source voltage controller circuit 60 shown by the associated chain lines.

Within circuit 41, there are resistors 19, 21, 23, 25, 28, 30, 32, 36; and Within circuit 57 there are resistors 46, 48, 54. Also within these two circuits are variable resistors 20, 33 and 55, as well as capacitors 26, 29 and 51. With the connections as shown, there are the transistors 22, 24, 31, 35, 49, 52, 53 and 56, as well as diodes 27, 58 and 50. The operational amplifier 34 and zener diode 47, connected as shown, complete the components of the circuits 41 and 57.

In FIG. 1, the horizontal deflection current control circuit 41 comprises the aforesaid DC voltage Vcc input terminal 18, vertical parabolic voltage input terminal 40, high-voltage control voltage $E_B$ input terminal 37, modulation voltage output terminal 38, resistors 19, 21, 23, 25, 28, 30, 32 and 36, variable resistors 20 and 33, transistors 22, 24, 31 and 35, capacitors 26 and 29, diodes 27 and 58, and operational amplifier 34. Also, the high voltage stabilizer circuit 57 comprises the aforesaid DC voltage $E_O$ input terminal 43, high-voltage control voltage $E_B$ output terminal 44, high-voltage detection input terminal 45, resistors 46, 48 and 54, variable resistor 54, transistors 49, 52, 53 and 56, diode 50, zener diode 47, and capacitor 51. The stabilizer circuit 57 is divided into the high voltage variation detector 59 and source voltage controller 60. The high voltage control voltage $E_B$ represents the source voltage of the horizontal deflection-high voltage circuit supplied to the primary side of the flyback transformer.

The operation of the above-described structure of FIG. 1 is as follows.

In FIG. 1, the resonance frequency of the resonance capacitor with a horizontal deflection coil 7 is set to be substantially equal to the resonance frequency of the resonance capacitor 6 with the modulation coil 9. These two resonance circuits are connected in series to each other and constitute a diode modulation type output stage as described previously in conjunction with the conventional example of FIG. 9. Therefore, the operation of such diode modulation type output stage is the same as previously described with respect to FIG. 9.

The high voltage stabilization circuit 57 in FIG. 1 is of a source voltage control type, wherein the detection voltage inputted from the high voltage detection voltage input terminal 45 and received by the transistor 56 and the variable resistor 55 is compared with a reference voltage Vref, which is obtained from the Zener diode 47, by the action of the differential amplifier consisting of the transistors 52 and 53, whereby the high voltage control voltage $E_B$ obtained from the high voltage control voltage output terminal 44 is so controlled as to maintain the high voltage constant.

Therefore, similar to the aforementioned conventional example of FIG. 9, the horizontal deflection current $I_{DY}$ is changed in the operation of FIG. 1 as well as in accordance with the variation caused in the high-voltage control voltage $E_B$ by the difference of the beam current Ib. With regard to this, and the embodiment of FIG. 1, the variation in the high-voltage control voltage $E_B$ is detected and then is superposed on the modulation voltage Vm to maintain constant the voltage $V_{DY}$ across the first scanning capacitor 8. In the operation of FIG. 1, differing from the conventional example with respect to FIG. 9 where the high-voltage variation is detected and superposed on the modulation voltage Vm after adjustment of the detected output, in operation of FIG. 1, the variation in the high-voltage control voltage (source voltage) $E_B$ outputted from the high voltage stabilizer circuit 57 is detected and superposed directly on the modulation voltage Vm to produce a voltage V'm shown in FIG. 11, where by the capacitor voltage is regulated as $V_{DY2}=V'_{DY1}$. Thus, despite any change in the high voltage control voltage $E_B$, the deflection current $I_{DY}$ is maintained constant. Consequently, no adjustment is required in the operation of FIG. 1, in contrast to the conventional operation discussed With respect to FIG. 9, hence obviating increase of the adjustment time and inducing no deterioration of the performance derived from some adjustment dispersion and secular change.

The following relates to operation of the horizontal deflection current control circuit 41, which carries out such stabilization of the horizontal deflection current $I_{DY}$.

In the horizontal deflection current control circuit 41, of FIG. 1, a level shifter is formed by the transistors 22, 24, resistors 19, 21, 23, 25, and variable resistor 20. In this level shifter, the variation of the high-voltage control voltage $E_B$ obtained from the high-voltage control voltage input terminal 37 is directly level-shifted with unity gain and is outputted from the collector of the transistor 24. For example, when the high voltage control voltage $E_B$ is varied in the range of 120+ a volts (that is with a variation of 2a volts), such control voltage is level-shifted in an amount of 100 volts by the level shifter and is thereby outputted as 20+ a volts. Subsequently, the output voltage of the level shifter is current-amplified by the operational amplifier 34 and the transistor 35, and then is fed to the modulation voltage output terminal 38. As a result, the modulation voltage Vm across the second scanning capacitor 10 is changed correspondingly to the variation in the high-voltage control voltage $E_B$ at a rate of 1:1, hence maintaining constant the voltage $V_{DY}$ across the first scanning capacitor. Accordingly, the horizontal deflection current $I_{DY}$ is also maintained constant.

The level shifter includes a current mirror circuit comprising transistors 22, 24, wherein the current flowing in the transistor 22 is changed by the variable resistor 20 to adjust the amount of level shift. Therefore, it becomes possible to facilitate adjustment of the horizontal deflection current $I_{DY}$ for adjusting the picture size. In FIG. 1, the aforesaid capacitor 29, resistors 28, 30, 32, variable resistor 33 and transistor 31 serve to superpose the vertical parabolic voltage, which is received from the parabolic voltage input terminal 40, on the output voltage of the level shifter (collector output of the transistor 24), thereby enabling horizontal side pin cushion correction. It is also possible to adjust the amount of side in cushion correction by changing the amplification factor of the vertical parabolic voltage by the variable resistor 33.

In FIG. 1, the capacitor 26 has a noise prevention function to remove the high frequency component contained in the output voltage of the level shifter (collector output of the transistor 24); the diode 27 serves for protection of the input to the operational amplifier 34; and the diode 58 is used for limiting the modulation voltage obtained from the modulation voltage output terminal 38.

According to this embodiment of FIG. 1, the horizontal deflection current can be stabilized despite any variation in the output voltage of the source-Voltage control type high voltage stabilizer, thereby eliminating the variation in the picture size. Furthermore, as mentioned above, this embodiment is so constructed that the change caused in the high-voltage control voltage $E_B$ due to the high-voltage control operation and the amount of correction of the horizontal deflection current $I_{DY}$ are rendered mutually coincident without the necessity of any adjustment, hence obviating the deterioration of the performance that may otherwise be induced by some adjustment dispersion and secular change. Consequently, it becomes possible to realize an improved composite horizontal deflection-high voltage circuit having satisfactory performance and capability with another advantage of reduced production cost. The reduced production cost is partly provided by the lack of necessity for structure regarding external adjustment of a resistor (which external readjustment of a resistor for control is necessitated in the above-described prior art). The prior art variable resistor adjustment is used for adjustment of the pattern and it is a manual adjustment, that is it is not automatic; this adjustment will change with time in a disadvantageous manner. For example, Japanese Laid-Open Publication No. 218604376 has a variable resistor for adjusting the screen pattern, which is manual and will change with time; this is not required due to the construction of the present invention. Further, the present invention can desirably be constructed as an integrated circuit, to further save production costs, because there is no necessity for providing a manually adjustable resistor that would prevent the complete construction in integrated form according to the prior art.

Figure 2:
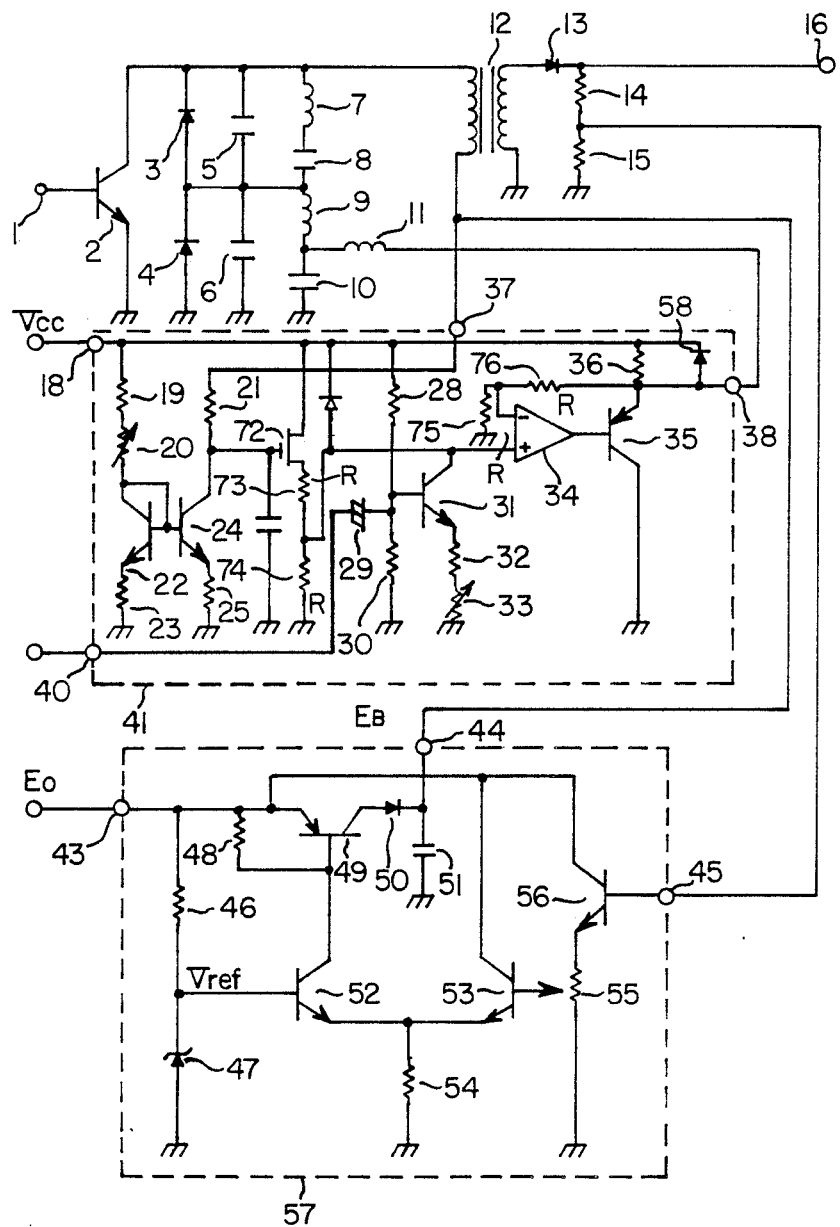
FIG. 2 is a circuit diagram showing an additional detail over that shown in FIG. 1.

The embodiment of FIG. 1 is set forth in greater detail with respect to FIG. 2, which shows the addition of MOSFET 72, resistors 73, 74 associated with the MOSFET, and resistors 75, 76 associated with a differential amplifier 34 (each having a resistance value R).

FIG. 2 specifically differs from FIG. 1 with respect to the point that the output voltage of the level shifter, that is the collector voltage of the transistor 24, is decreased to one-half by the MOSFET 72 and the transistors 73, 74, and subsequently is doubled again by the operational amplifier 34 and the resistor 75 and 76, before being outputted. That is, the unity gain of FIG. 1 is also to be found in FIG. 2, but FIG. 2 shows a specific manner in which this unity gain is obtained, by first halfing and then doubling.

In such a circuit configuration where the voltage value obtainable finally is the same as the output voltage of the level shifter, the effect of the present invention is not impaired at all regardless of whether the voltage is attenuated to 1/n (in which n is a natural number) or is amplified by n times in the intermediate stage. The embodiment of FIG. 2 has the particular advantage that if the voltage difference is big from the level shifter at the output of transistor 24, then dividing this voltage by 1/n will reduce it to fit the dynamic range of the operational amplifier, whereby an amplifier having a lower operational range, and therefore reduced construction cost, can be employed. The collector of transistor 24 provides a voltage difference, which equals the voltage difference of Eb mixed with the pin cushion voltage.

Whereas the prior art controls current of the basis of a voltage difference before the output transistor, and the transistor 49 changes its output greatly with respect to temperature; the present invention uses the output of transistor 49 as a control voltage difference for current control.

Figure 3:
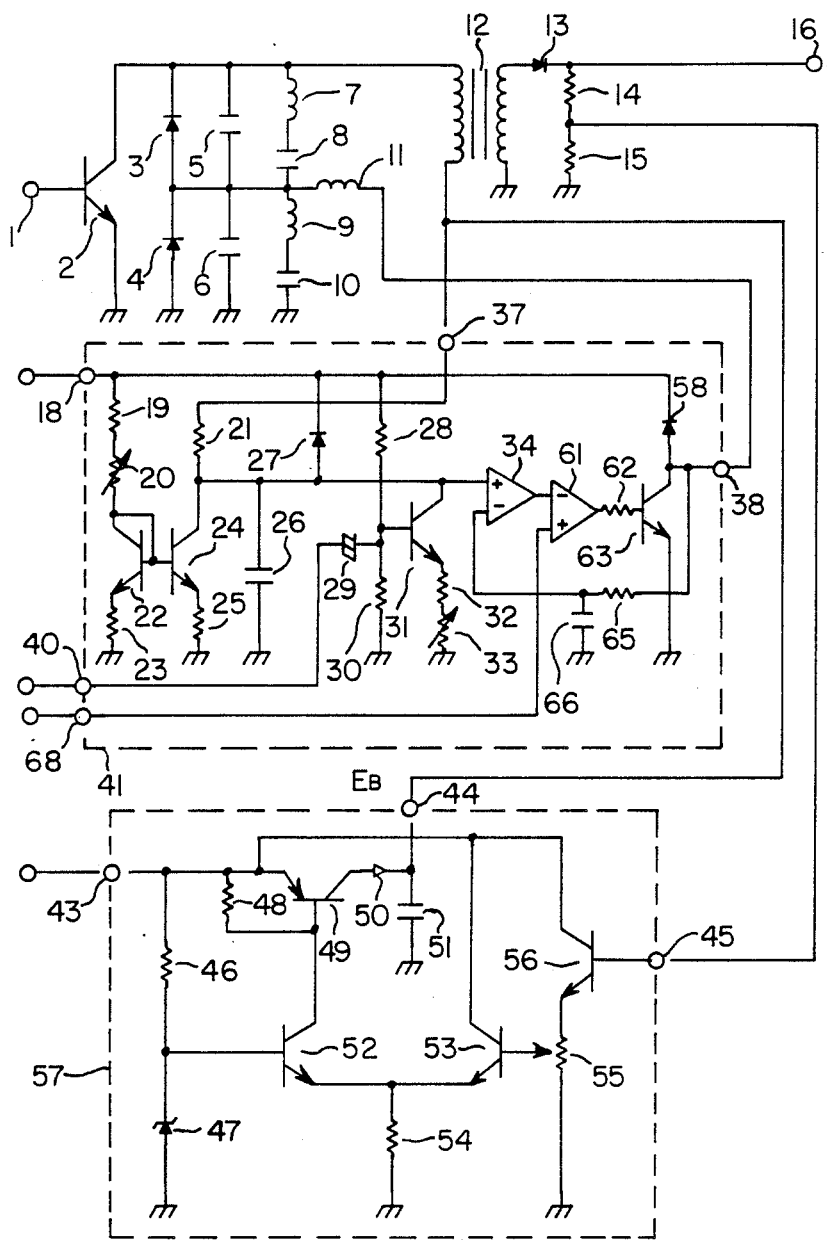
FIG. 3 is a circuit diagram showing an additional detail from the circuits previously described.

FIG. 3 shows a further detail that may be employed with the present invention, and differs from FIG. 1 by the provision of a horizontal saw tooth voltage input terminal 68 for the horizontal deflection control circuit 41, which feeds a signal to the positive terminal of comparator 61, which has output resistor 62 feeding the base of transistor 63. Transistor 63 differs in its configuration from transistor 35 of FIG. 1 in that its emitter is connected to ground while its collector is connected to terminal 38; also the resistor 36 of FIG. 1 is replaced by resistor 65 and capacitor 66 in the feedback circuit for the amplifier 34. That is, the difference of the first embodiment of FIG. 1 resides in the employment of a holtz-width modulator type horizontal deflection current control circuit 41 that serves as a modulation voltage output circuit in the entire configuration.

In the circuit of FIG. 3, the voltage outputted from the operational amplifier 34 is compared with the horizontal saw tooth voltage obtained from the horizontal saw tooth voltage input terminal 68 by the comparator 61 to produce a pulse-width modulated rectangular signal, which is then outputted as a modulation voltage from the collector of the transistor 63. The average value of such modulation voltage is applied by negative feedback to the minus terminal of the operational amplifier 34 by way of an integrator consisting of a resistor 65 and capacitor 66, thereby stabilizing the modulation voltage. As a result, any loss caused through the transistor 35 in FIG. 1 can be diminished in FIG. 3 to consequently realize, with minimum loss, the effect mentioned in conjunction with the first embodiment. Also, the power consumed by FIG. 3 is less because the on/-off is obtained with the duty cycle of the pulse width modulation to provide for a power consumption of about 0.21 for the circuit of FIG. 3, whereas the circuit of FIG. 1 would have a power consumption of about 4 watts because the power is always on for transistor 35 of FIG. 1, in contrast to the on/off power for the transistor 63 in FIG. 3.

Figure 4:
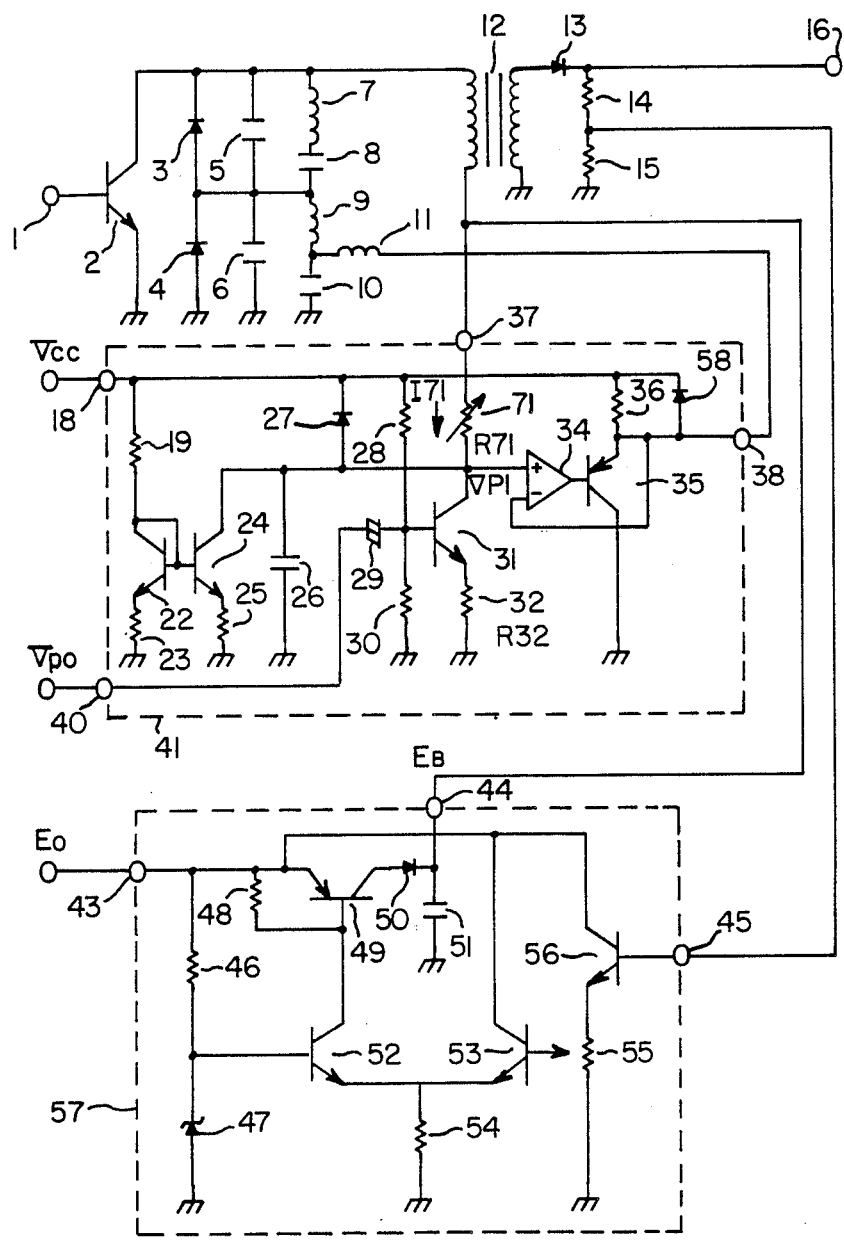
FIG. 4 is a circuit diagram showing an additional detail over that shown in the previous circuits.

The additional detail provided by FIG. 4 that is not shown in FIG. 1 relates to the variable resistors 20 and 33 of FIG. 1 being removed, and the resistor 21 being replaced with a variable resistor 71. The feature of FIG. 4 resides in that both a picture size and the amount of side pin cushion correction are adjusted by a single variable resistor 71. The advantage is obvious, because the one variable resistor 71 can perform the function of the two variable resistors 20, 33 of FIG. 1.

A further description of the operation will now be set forth. Essentially, the amount of side pin cushion correction is determined by the magnetic field distribution of a deflection yoke. In any of deflection yokes having the same winding specification, the amount of side pin cushion correction is determined substantially uniquely (although several percent dispersion may be caused by some errors in the winding distribution and so forth). Since the voltage $V_{DY}$ across the first scanning capacitor 8 in FIG. 4 is in proportion to the horizontal deflection current $I_{DY}$, the peak-to-peak value Vp1 of the vertical parabolic Voltage required for correction of the side pin cushion distortion is expressed as $$Vp1 = k\ V_{DY} \quad (4)$$

where k is a constant.

The capacitor voltage $V_{DY}$ is set by the voltage drop $v_{71}$ caused by the variable resistor 71 in FIG. 4, so that the following relationship exists:

$$V71 = V_{DY} \quad (5)$$

Consequently, the conditions of the following equations (6) and (7) are satisfied by the relationship among the resistance values V71 and R32 of the variable resistor 71 and the resistor 32, the current I71 flowing in the variable resistor 71 and the peak-to-peak value Vpo of the vertical parabolic voltage received from the parabolic voltage input terminal 40:

$$V71 = R71\ I71 \quad (6)$$

$$Vp1 = (R71/R32)\ Vpo \quad (7)$$

Therefore, from equations (6) and (7), the following equation is obtained $$Vp1 = Vp0\ V71/R32\ I71 \quad (8)$$

Accordingly, if the voltage $V_{p0}$, resistance R32 and current I71 are selectively determined on the basis of equations (4) and (8), to satisfy the following condition $$k = Vpo/R32\ I71 \quad (9)$$

Then it becomes possible to alter the amount of side pin cushion correction in compliance with the horizontal display size adjusted by the display unit by changing the resistance R71. Further, even when the voltage $V_{DY}$ is changed in order to conform with any different horizontal frequency specification, it is still possible to alter the amount of side pin cushion correction in compliance with adjustment of the value R71 of the variable resistor 71.

Figure 5:
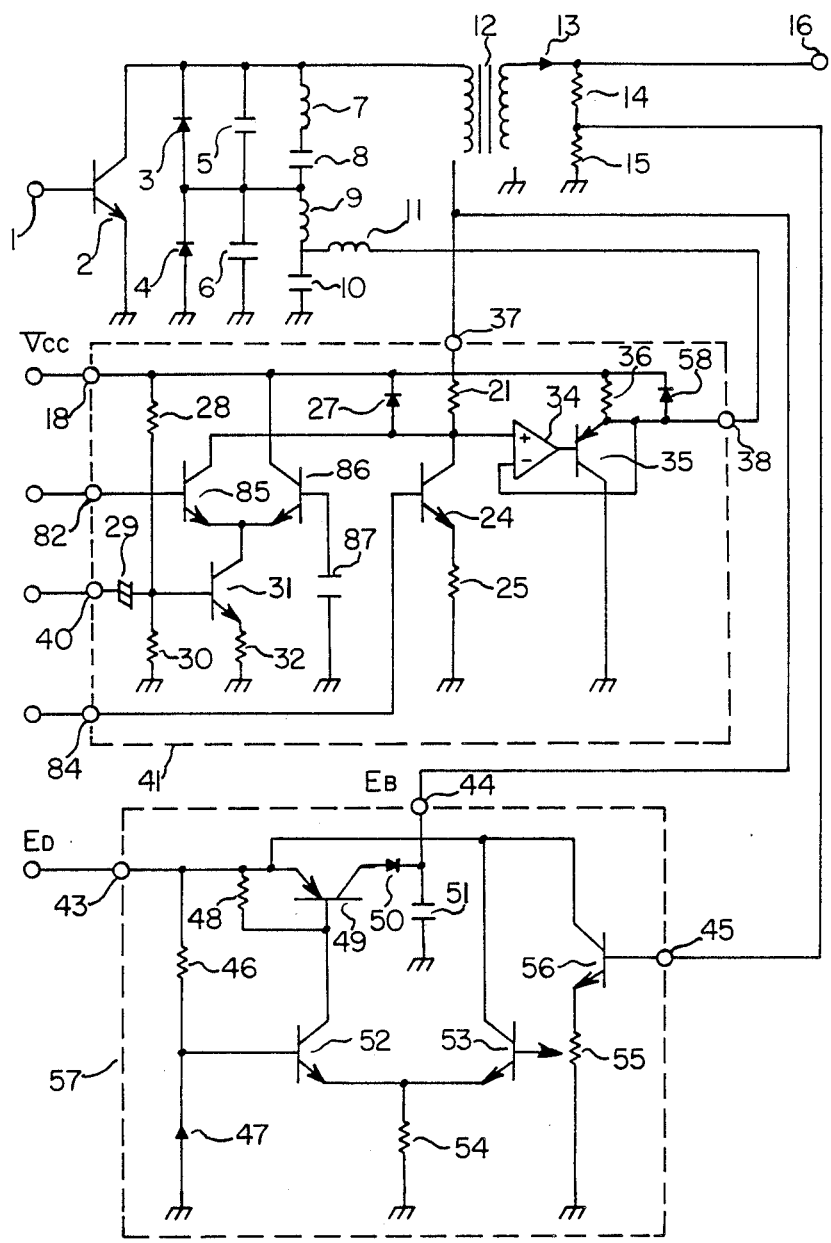
FIG. 5 is a circuit diagram showing an additional detail over the circuits of the preceding figures.

With respect to differing from FIG. 1, the circuit of FIG. 5 includes a side pin cushion control voltage input terminal 82, a size control voltage input terminal 84, transistors 85, 86, and cost and voltage source 87. As compared with the circuit of FIG. 1, the circuit of FIG. 5 has a feature in that the side pin cushion correction and the size adjustment are performed automatically in compliance with the difference of the horizontal frequency.

In the circuit of FIG. 5, the following operation is performed. In this diagram, the high-voltage stabilizer circuit 57 changes the high-voltage control voltage $E_B$ in a manner to maintain constant the high voltage generated in the flyback transformer 12, despite any difference of the horizontal frequency. For example, the high voltage control voltage $E_B$ is regulated to be low when the horizontal frequency is low, whereas the high-voltage control voltage $E_B$ is regulated to be high when the horizontal frequency is high. However, if the level shift by the resistor 21 is kept at a fixed amount, the voltage $V_{DY}$ across the first scanning capacitor 8 is also kept unchanged, so that there occurs a change in the horizontal deflection current $I_{DY}$. This relationship is expressed as $$I_{DY} = V_{DY}\ T_{HD}/L_{DY} \quad (10)$$

In which $T_{HD}$ denotes a horizontal scanning interval. In the circuit of FIG. 5, where the horizontal blanking interval is fixed, the horizontal scanning interval becomes shorter with rise of the horizontal frequency, and the horizontal deflection current $I_{DY}$ is smaller.

In view of such circumstances, the circuit according to FIG. 5 is so constructed that a size control voltage is changeable linearly with respect to the horizontal frequency and fed from the size control voltage input terminal 84, and the current flowing in the transistor 24 is changed in accordance with the change in the size control voltage, whereby the amount of level shift by the resistor 21 is corrected in accordance with the change in the horizontal frequency.

In FIG. 5, the transistors 31, 85 and 86 constitute a multiplier circuit for multiplying the vertical parabolic voltage and the side pin cushion control voltage (only 82 is changed linearly with respect to the horizontal frequency) fed respectively from the vertical parabolic voltage input terminal 40 and the side pin cushion control voltage input terminal 82. Consequently, the amplitude of the vertical parabolic voltage applied to the output circuit through the operational amplifier 34 and the transistor 35 can be automatically altered in compliance with the difference of the horizontal frequency.

The size control voltage and the side pin cushion control voltage can be formed with facility by frequency-to-voltage conversion or the like of the horizontal synchronizing signal. As described above, the circuit of FIG. 5 is capable of accomplishing, in addition to the aforementioned effect attained by the circuit of FIG. 1, automatic alteration of the size adjustment and the side pin cushion correction in compliance with the difference of the horizontal frequency. With respect to the above-mentioned linearity, $V_{DY}$ would vary linearly when plotted with respect to frequency.

Figure 6:
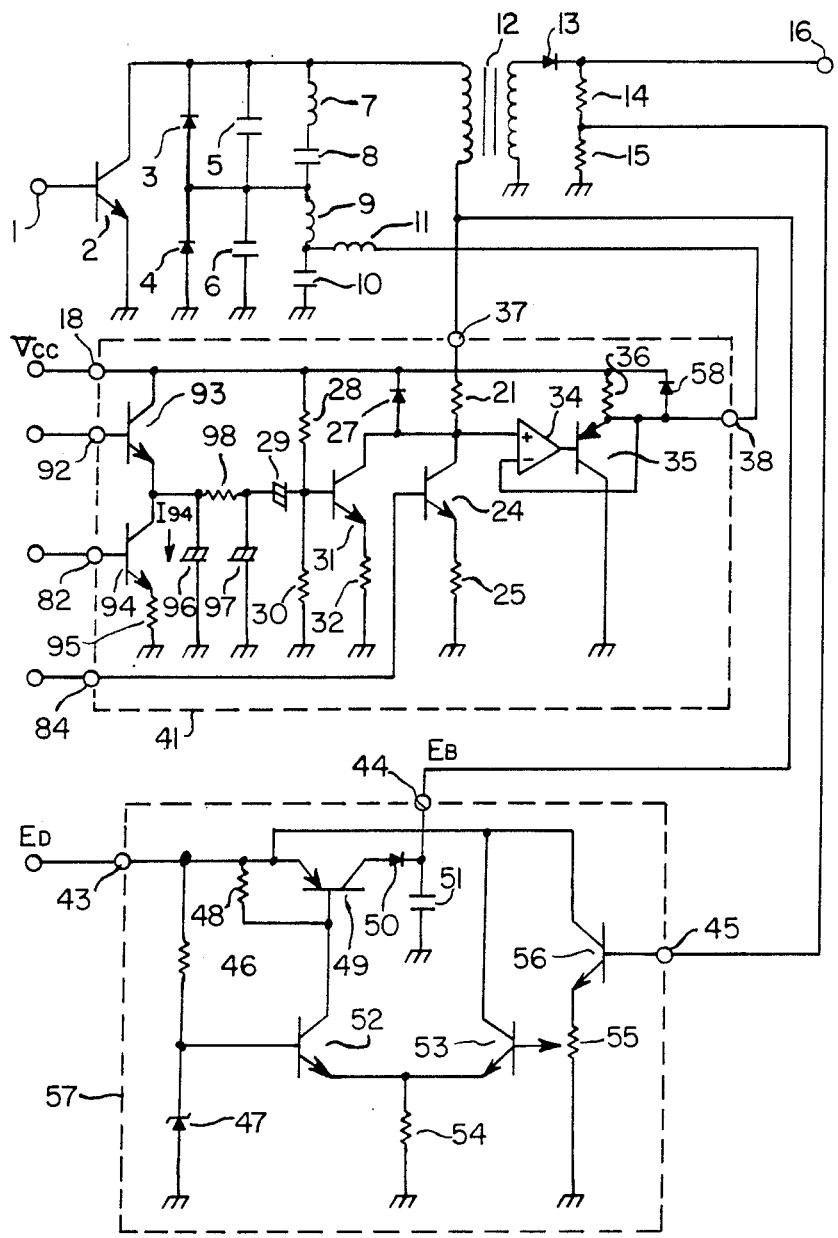
FIG. 6 is a circuit diagram showing a further detail over the circuits of the preceding figures.

In addition to the above-described structure, the circuit of FIG. 6 includes a vertical blanking pulse input terminal 92, transistors 93 and 94, resistors 95 and 98, and capacitors 96 and 97. As compared with the circuit of FIG. 5, the circuit of FIG. 6 is a method of forming a vertical parabolic voltage applied for correction of the side pin cushion distortion. The method of forming such vertical parabolic voltage is described below with reference to FIG. 7.

In the circuit of FIG. 6, a vertical saw tooth voltage $v_{SW}$ (FIG. 7(b)) is produced out of a vertical blanking pulse $v_{BLK}$ (FIG. 7(a)) received from the vertical blanking pulse input terminal 92, by combination of capacitor 96 and a constant current circuit consisting of transistor 94 and resistor 95. The vertical saw tooth voltage $v_{SW}$ thus produced is integrated by an integrator consisting of a resistor 98 and a capacitor 97, hence forming a vertical parabolic voltage $V_{PL}$ (FIG. 7(c)).

The amplitude of the vertical parabolic voltage $v_{PL}$ thus obtained is determined by the current I94 flowing in the constant current circuit consisting of transistor 94 and resistor 95, and the value of such current I94 is determined by the side pin cushion control voltage received from the side pin cushion control voltage input terminal 82.

For example, when the side pin cushion control voltage is low, the current I94 is rendered small so that the vertical saw tooth voltage $v_{SW}$ becomes $v_{SW1}$ as shown in FIG. 7(b) while the vertical parabolic voltage $v_{PL}$ becomes $v_{pL1}$, as shown in FIG. 7(c). To the contrary, when the side pin cushion control voltage is high, the current I94 is rendered great so that the vertical saw tooth voltage $v_{SW}$ becomes $v_{SW2}$ as shown in FIG. 7(b), while the vertical parabolic voltage $v_{PL}$ becomes $v_{PL2}$, as shown in FIG. 7(c).

It follows, therefore, that the amount of side pin cushion correction can be altered by changing the side pin cushion control voltage. Consequently, automatic adjustment of the amount of side pin cushion correction is achievable in compliance with the difference of the horizontal frequency by inputting the side pin cushion control voltage, which is represented as a function of the horizontal frequency, from the side pin cushion control voltage input terminal 82.

For controlling the amount of such side pin cushion correction, the circuit according to FIG. 5 includes a multiplier that utilizes a differential pair of transistors 85, 86, so that the side pin cushion control voltage received from the side pin cushion control voltage input terminal 82 is in a narrow dynamic range (where satisfactory linearity is attained merely with an amplitude of +100 mV, or the like). However, in using the circuit according to FIG. 6, it is possible to achieve a relatively wide dynamic range of the side pin cushion control voltage.

Figure 8:
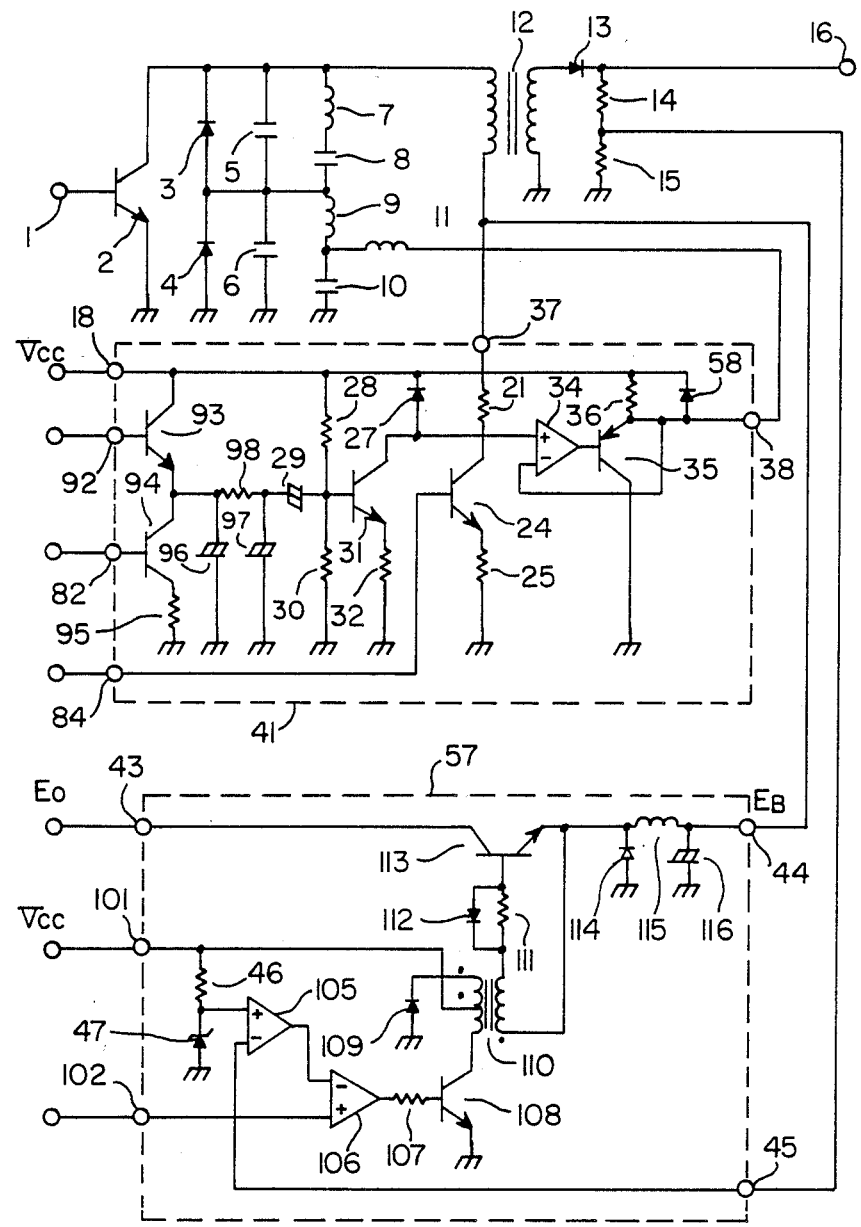
FIG. 8 is a circuit diagram showing an additional detail over the circuits shown in the previous figure.

The circuit according to FIG. 8 will now be described. In FIG. 8, a DC voltage Vcc is provided to input terminal 101, a horizontal saw tooth voltage is provided to input terminal 102, an operational amplifier 105 is also provided in addition to a comparator 106, resistors 107 and 111, diodes 109, 112, 114, transistors 108, 113, transformer 110, coil 115, and a capacitor 116.

As compared with the circuit of FIG. 6, the circuit according to FIG. 8 differs in the provision of a chopper type source voltage controller being employed for the high-voltage stabilizer circuit 57.

In the high-voltage stabilizer circuit 57 shown in FIG. 8, a reference voltage obtained from the Zener diode 47 and a high-voltage detection voltage received from the high-voltage detection voltage input terminal 45 are fed to the operational amplifier 105, which then controls the pulse width of the output voltage from the comparator 106. The conduction time of the transistor 113 is so controlled that the high voltage outputted from the flyback transformer 12 is maintained constant. As a result, the loss caused in the high-voltage control output transistor 113 can be reduced to less than the loss in the high voltage control output transistor 49 in the circuit of FIG. 6. Such chopper type high-voltage stabilizer circuit is effective particularly in a multi-frequency system where the source voltage for the horizontal deflection output circuit needs to be changed in accordance with the difference of the horizontal frequency.

According to the composite horizontal deflection-high voltage circuit of the present invention, as described thus far, the horizontal deflection current can be maintained constant with stability despite any variation induced in the output voltage of the high voltage stabilizer even in the case of a source-voltage control type having satisfactory regulation characteristic. Furthermore, in the circuit of the present invention where the variation component in the output voltage of the high voltage stabilizer is superposed directly on the modulation voltage for stabilizing the horizontal deflection current, the conventional adjustment executed by means of a variable resistor or the like manually in the prior art is rendered unnecessary to consequently avert increase of the adjustment time as well as to prevent deterioration of the performance that may otherwise be caused by some adjustment dispersion and secular change.

In FIG. 8, the circuit 57 is of a different construction than the circuits 57 previously shown, and the circuit of FIG. 9, as well as other similar circuits, may alternately be provided with respect to any of the overall circuits, for example in place of the circuit 57 shown in FIGS. 1-6. As shown in FIG. 9, the voltage stabilizer circuit 57 employs input 43 for voltage Eo, input 101 for voltage Vcc, input 102, and outputs 44 for voltage $E_B$ and output 45. The circuit 57, in FIG. 8, includes resistors 46, 107, 111; zener diode 47, differential amplifiers 105, 106; diodes 109, 112, 114; transistors 108, 113; transformer 110; inductor 115: and capacitor 116. These elements are all connected as shown in the drawing to perform the functions of the circuit as previously described.

Figure 12:
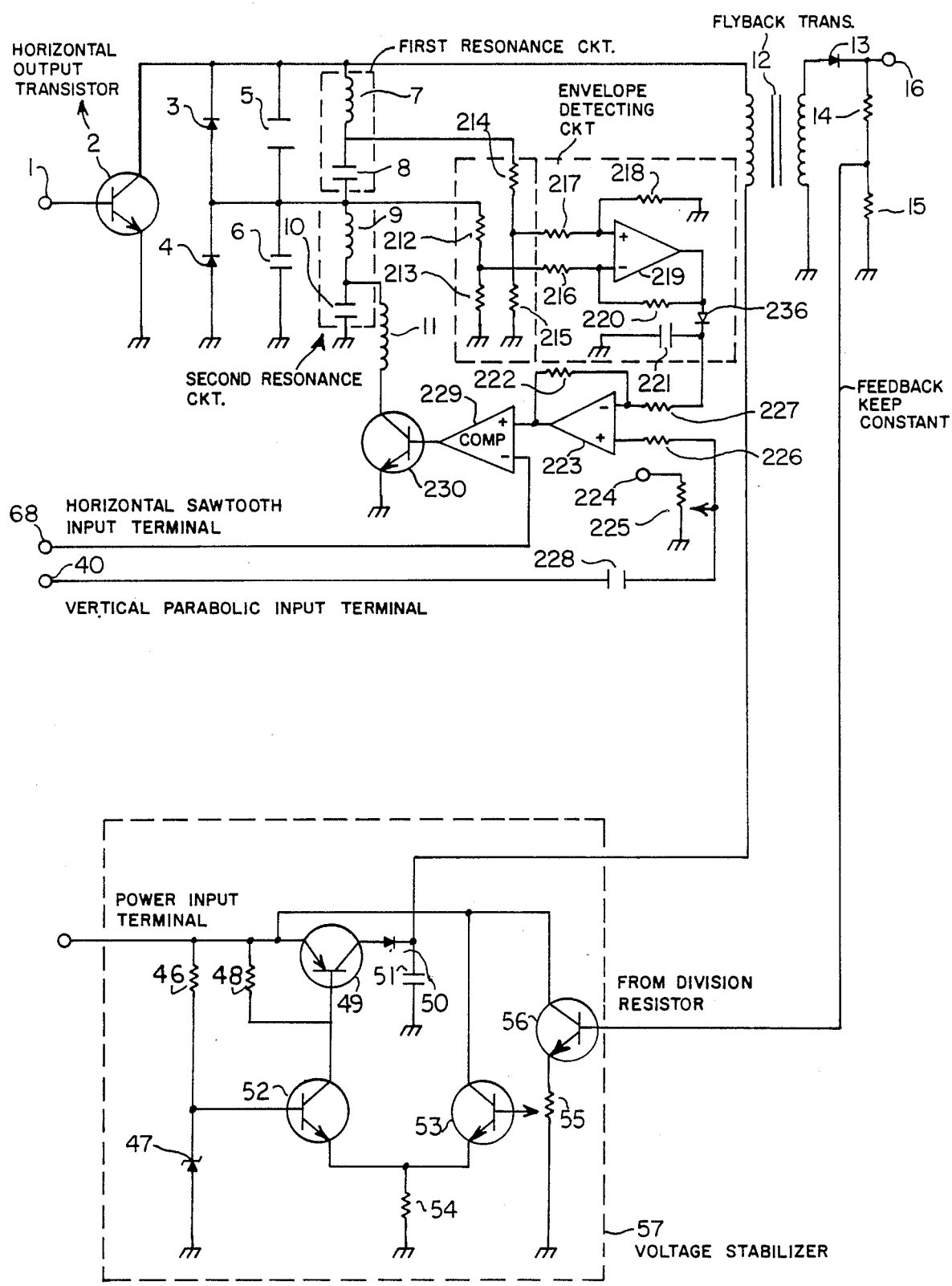
FIG. 12 is a circuit diagram of a further variation of the horizontal deflection-high voltage circuit.

In FIG. 12, elements 1, 2, 3, 5, 6, 7, 8, 9, 10, 11, 12, 13, 14, 15, 16 all function and are all connected in the manner previously described with respect to FIG. 1. Further, circuit 57 of FIG. 12 is identical to circuit 57 of FIG. 1.

In the composite horizontal deflection-high voltage circuit, according to the previous invention, it is necessary to stabilize the high voltage and the horizontal deflection current for maintaining the picture size constant. This has been described previously. The high voltage detected by the voltage divider 14, 15 is supplied through the detection transistor 56 and the variable resistor 55 to the base of the error amplifier transistor 53. A constant voltage obtained from the resistor 46 and the zener diode 47 is applied to the base of another error amplifier transistor 52. Accordingly, if there occurs a drop in the high voltage at the base of the detector 56, for example, a stabilizing control operation is so performed that less current flows through detection transistor 56, less voltage drop occurs at variable resistor 55 and the base voltage of the error amplifier transistor 53 falls to cause less current flowing through resistor 54 so that there is less voltage drop across resistor 54 that produces a drop in the base voltage of the control transistor 49 because error amplifier transistor 52 stays on the same amount as the zener diode 53, thereby increasing the voltage of the capacitor 51 to consequently raise the high voltage. This operation is discussed in the aforementioned U.S. Pat. No. 4,649,465.

Stabilizing the horizontal deflection current is carried out in the following manner. First, a description will be given of the operation of the diode modulation type output stage with reference to FIG. 10, which has already been described to some extent. With respect to FIG. 10, the current $I_{DY}$ is the peak-to-peak value for the current flowing in the horizontal deflection coil 7; Im denotes the peak-to-peak value of the current flowing in the modulation coil 9; and Imod denotes the peak-to-peak value of the current flowing from the junction of the damper diodes 3 and 4 to the junction of the first scanning capacitor 8 and the modulation coil 9. Such currents are so changed as graphically represented in FIG. 10 by the voltage (modulation voltage Vm) of the second scanning capacitor 10. Eb is the source voltage supplied to the primary side of the flyback transformer 12; Ly is the inductance of the horizontal deflection coil 7; Lm is the inductance of the modulation coil 9; and Vcp is the collector pulse voltage. It is observed from FIG. 10 that the horizontal deflection current $I_{DY}$ can be changed by the modulation voltage Vm while the collector pulse voltage Vcp with respect to transistor 2 remains unchanged. That is, in this circuit, modulation of the horizontal deflection with side pin cushion correction or the like is rendered possible without changing the high voltage. However, if the source voltage control is executed for stabilizing the high voltage, there occurs a variation in the horizontal deflection current. This phenomena will be described below with reference to FIG. 11.

As graphically represented in FIG. 11, when the beam current Ib is increased from Ib1 to Ib2, the source voltage EB is raised from EB1 to EB2 for maintaining the high voltage constant. In this case, the voltage $V_{DY}$ across the first scanning capacitor 8 is changed from $V_{DY1}$ to $V_{DY2}$ while the voltage Vm is changed from Vm1 to Vm2. Such voltage changes are due to the relationship expressed by previously set forth equations (1) (2), and (3). In view of this, the present invention is equipped with a pulse-width modulation voltage controller that first detects the horizontal deflection current and the adjusts the modulation voltage Vm to Vm' to maintain constant the voltage Vy of the first scanning capacitor 8. Due to the above operation, the capacitor voltage is retained as $V'_{DY2}=V_{DY1}$ as shown in FIG. 11.

Such operation for controlling the horizontal deflection current will now be described in further detail.

In FIG. 12, the operational amplifier 219, resistors 212, 213, 214, 215, 216, 217, 218, 220, capacitor 21 and diode 236 constitute a circuit D for detecting the envelope of the horizontal deflection current, wherein the voltage $V_{DY}$ across the first scanning capacitor 8 is detected by means of the voltage division resistors 14, 15. After subtraction, $V_{DY}-Vm$, by the operational amplifier 219, the output of the operational amplifier 219 is rectified and smoothed by a combination of the diodes 236 and the capacitor 221, so that the envelope of the horizontal deflection current is outputted. The output voltage thus obtained is applied through resistor 227 to an inverse input terminal of the operational amplifier 223. A horizontal deflection current modulation signal (for example side pin cushion correcting vertical parabolic signal) fed to the modulation signal input terminal 40 is applied through resistor 226 to a non-inversion input terminal of the operational amplifier 223 having feedback resistor 222 through AC coupling by way of the capacitor 228. Furthermore, the positive voltage applied to the positive power input terminal 224 is adjusted by means of the variable resistor 225 and then is applied also to the non-inversion input terminal of the operational amplifier 223. This amplifier 223 serves to amplify the differential error between the two signals fed respectively to the inverse and non-inverse input terminals thereof and produces an output, which is fed to the non-inversion input terminal of the comparator 229. As a result, the comparator 229 produces a pulse-width modulated pulse output of the horizontal period. The switching transistor 30 performs it sWitching action in response to such pulse, so that a signal obtained by inverting the pulse-width modulated wave inputted to the base of the switching transistor 230 is outputted from its collector. This output signal is then smoothed by a combination of the coil 11 and the second scanning capacitor 10, so that the voltage Vm of the scanning capacitor 10 is shaped into a demodulated wave form of the pulse-width modulated signal. Consequently, the voltage $V_{DY}$ of the first scanning capacitor 8 becomes opposite in phase to the voltage Vm. Due to the negative feedback control mentioned above, a complete coincidence is obtained between the envelope wave form 265 of the horizontal deflection current 264 as shown in FIG. 16(a) (input voltage to the inverse input terminal of the operational amplifier 23) and the input voltage 266 to the non-inverse input terminal of the operational amplifier 223 shown in FIG. 16(b) (some voltage of the modulation signal fed to the modulation signal input terminal and the voltage at the midpoint of the variable resistor 225). Thus, despite any variation in the source voltage Eb, the horizontal deflection current continuously retains the same envelope as that of the sum voltage of the modulation signal and the midpoint voltage of the variable resistor 225, whereby it desires to stabilization can be achieved.

Since both the high voltage and the horizontal deflection current are stabilized automatically by the two negative feedback control operations mentioned, there occurs no deterioration in the circuit performance that may otherwise be harmfully affected by some adjustment dispersion and secular change, hence realizing an improved composite horizontal deflection-high voltage circuit that requires no adjustment and still possesses enhanced capability with an advantage in regard to the production cost. Specifically, there is no mechanical adjustment that would require a mechanical connection to the outside of the circuit, so that the costs are greatly reduced and the circuit may be entirely integrated.

Figure 13:
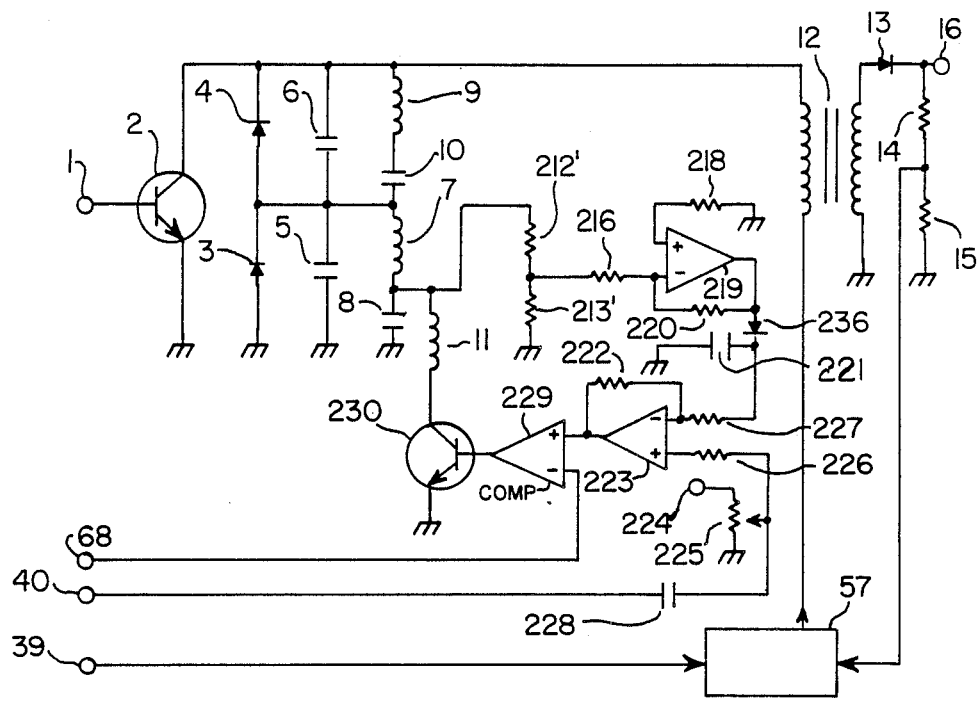
FIG. 13 shows a variation of the circuit according to FIG. 12.

FIG. 13 employs a circuit that differs from the circuit of FIG. 12 in the constitution of the diode modulation output stage and the envelope detector. As compared with FIG. 12, the upper and lower resonance circuits in the diode modulation output stage of FIG. 13 are replaced with each other. In FIG. 13, therefore, the voltage of the first scanning capacitor is directly detected through division by resistors 212' and 213'. The operational amplifier 219 performs only simple inversion amplification. Meanwhile, the output of the pulse-width modulation voltage controller serves for directly changing the voltage of the first scanning capacitor to execute stabilization of the horizontal deflection current under control.

Figure 14:
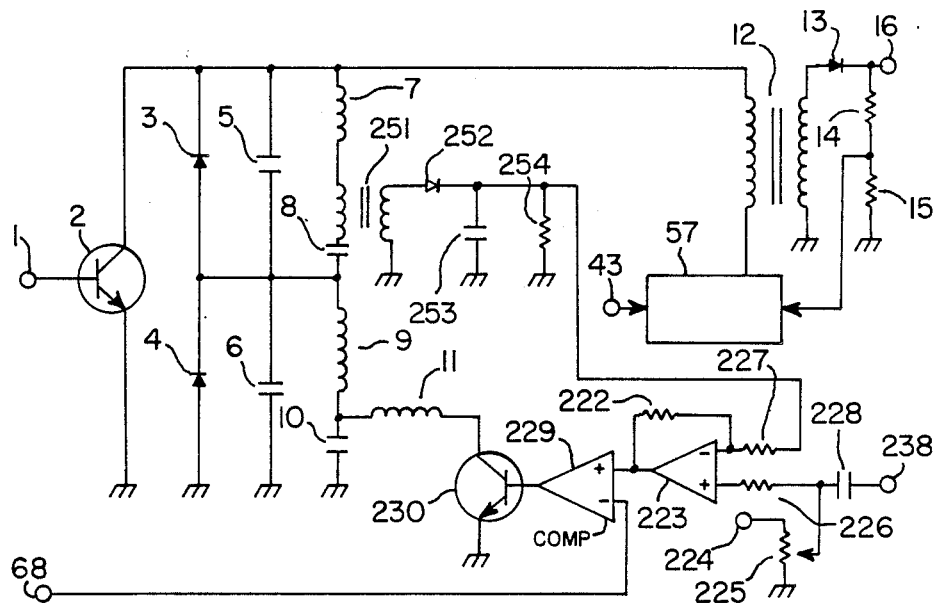
FIG. 14 is a circuit showing a variation of the circuit of FIG. 12.

The circuit shown in FIG. 14 differs from the circuit shown in FIG. 12 with respect to the envelope detector. The envelope detector in FIG. 14 comprises a current transformer 251, a diode 252, a capacitor 253 and a resistor 254. In the circuit of FIG. 14, the horizontal deflection current is detected by the current transformer 251 and then is rectified and smoothed by a combination of the diode 252, the capacitor 253 and the resistor 254 to become an envelope signal of the horizontal deflection current. The remaining operation is the same as previously described with respect to FIG. 12.

In the circuit constructed according to FIG. 5, there is a difference with respect to the circuit of FIG. 12 with respect to the envelope detector The envelope detector shown in FIG. 15 comprises resistors 214', 215, 212, 213, 216, 217, 218, 220, diodes 255, 256, capacitors 257, 258, and an operational amplifier 219. The voltage across the horizontal deflection coil 7 is detected through voltage division by the resistors, as before, and, after being rectified and smoothed by a combination of the diodes 255, 256, and the capacitors 257, 258, the voltage is inputted to the operational amplifier 219. Then, the operational amplifier 219 executes subtraction and produces, as its output, an envelope signal of the horizontal deflection current. The other operation is the same as previously described with respect to FIG. 12.

Figure 17:
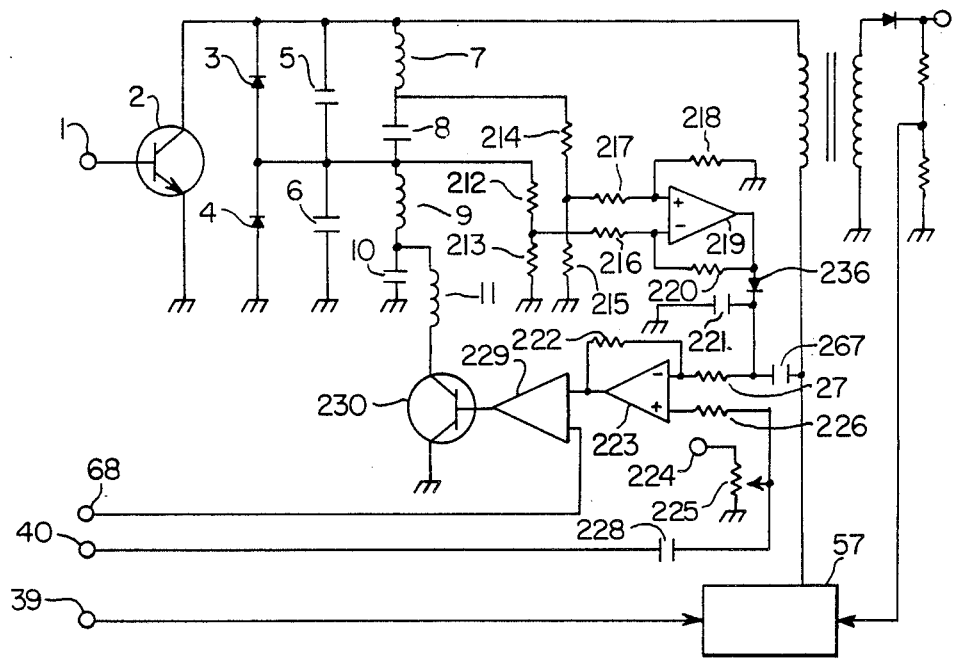
FIG. 17 is a circuit shoWing a variation in the circuit of FIG. 12.
Figure 18A:
FIG. 18 illustrates signal wave forms useful in explaining the operation of the circuit according to the present invention.
Figure 18B:
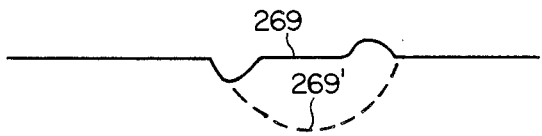
Figure 18C:
Figure 18D:
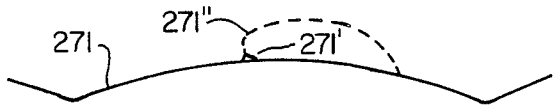

When comparing FIG. 17 with FIG. 12, the difference relates to the addition of a capacitor 267. Owing to the existence of this capacitor 267, the high frequency component in the voltage change caused by the source-voltage control type high voltage stabilizer circuit 57 is fed to the inverse input terminal of the operational amplifier 223 to improve the transition response at the time of any sudden variation in the source voltage.

The advantageous effect achieved with respect to the circuit of FIG. 17 will now be described in detail with reference to FIG. 18. In the wave form chart of FIG. 18, there is shown a beam current 268, a high voltage 269 obtained in the presence of the high voltage stabilizer circuit 57, a high voltage 269' obtained without the high voltage stabilizer circuit 57, a source voltage 270 (output voltage of the high voltage stabilizer 57) applied to the primary side of the flyback transformer 12, a horizontal deflection current envelope 71 formed by using the circuit of FIG. 17, a horizontal deflection current envelope 271' formed by using the circuit of FIG. 12, and a horizontal deflection current envelope 271" formed without the horizontal deflection current stabilization by the present invention. It is obvious from a comparison of the conventional envelope 271" with the improved envelope 271' or 271, that the remarkable effect of stabilizing a horizontal deflection current is accomplished by the present invention.

It is described hereinabove, according to the composite horizontal deflection-high voltage circuit of the present invention, the high voltage stabilization is carried out by a process of detecting the high voltage and then controlling the source voltage, while the horizontal deflection current stabilization is carried out by a process of first detecting the current envelope and then controlling the voltage distribution of two scanning capacitors in the diode modulation type output stage in such a manner that the envelope becomes coincident with the modulated wave form of the horizontal deflection current, hence attaining conspicuous effects in realizing the lack of necessity of manual adjustment as well as in eliminating the circuit performance deterioration that may otherwise be induced by some adjustment dispersion or circular change.

In accordance with the present invention, the features shown in detail in FIGS. 1-6 and 8 may be all provided in combination with each other and or in different combinations as determined within the scope of the following claims.

We claim:

1. Horizontal deflection signal and high voltage signal generator for driving a cathode ray tube comprising:
   a horizontal output transistor;
   a damper diode connected to said horizontal output transistor in parallel;
   a resonance means having a first resonance circuit and a second resonance circuit connected in parallel to said damper diode, wherein said first resonance circuit has a horizontal deflection coil connected to a first capacitor in series and said second resonance circuit has a modulating coil connected to a second capacitor in series;
   a flyback transformer wherein one end of a first winding of said flyback transformer is connected to said first resonance circuit;
   a voltage regulating means connected betWeen the other end of said first winding of said flyback transformer and a voltage supply terminal, which controls voltage supplied to said first winding of said flyback transformer for keeping output voltage on a second winding of said flyback transformer constant; and
   a horizontal deflection current control means which detects deviation of said voltage supplied to said first capacitor and controls a voltage supplied to said second capacitor according to said detected deviation.

2. A horizontal deflection signal and high voltage signal generator according to claim 1, wherein said horizontal deflection current control means has envelope detecting means which detects the envelope of deflection current flowing to said first resonance circuit which corresponds to variation of said voltage supplied to said first capacitor.

3. A horizontal deflection signal and high voltage signal generator according to claim 2, wherein said horizontal deflection current control means controls said voltage supplied to said second resonance circuit for equating said envelope and waveform of a horizontal deflection current modulating signal.

4. A horizontal deflection signal and high voltage signal generator according to claim 2, wherein said horizontal deflection current control means generates a difference signal of said envelope and a horizontal deflection current modulating signal, and amplify said difference signal and supply to said second capacitor.

5. A horizontal deflection signal and high voltage signal generator according to claim 2, wherein said horizontal deflection current control means has a current transformer connected to said horizontal deflection coil in series.

6. A horizontal deflection signal and high voltage signal generator according to claim 2 wherein said output terminal of said horizontal deflection current control means is connected to said voltage supply terminal of said first winding of said flyback transformer through a capacitor.

7. A horizontal deflection signal and high voltage signal generator according to claim 1, wherein said horizontal deflection current control means detects variation of voltage supplied to said first winding of said flyback transformer from said voltage regulating means and supply said detected variation of said voltage to said second capacitor through a level shift means.

8. A horizontal deflection signal and high voltage signal generator according to claim 7, wherein said horizontal deflection current control means has a side pincushion correction means connected to an output terminal of said level shift means and side pincushion correction signal mixed to said output signal of said level shift means.

9. A horizontal deflection signal and high voltage signal generator according to claim 8, wherein said horizontal deflection current control means has a voltage divider and an amplifier connected to said output terminal of said level shift means, wherein said voltage divider outputs 1/N voltage of said output signal of said level shift means and the gain of said amplifier is N.

10. A horizontal deflection signal and high voltage signal generator according to claim 7, wherein said horizontal deflection current control means has a pulse width modulation means connected to said level shift means.

11. A horizontal deflection signal and high voltage signal generator according to claim 7, wherein said horizontal deflection current control means, has a voltage which varies with a horizontal deflection frequency are with said output signal of said level shift means.

12. A horizontal deflection signal and high voltage signal generator according to claim 8, wherein said horizontal deflection current control means and said side pincushion correction means varies amplitude of said output signal of level shift according to horizontal deflection frequency.

13. A horizontal deflection signal and high voltage signal generator according to claim 1, wherein said horizontal deflection current control means, and said voltage regulating means has a chopper circuit.

14. A horizontal deflection signal and high voltage signal generator for driving a cathode ray tube comprising:
- a horizontal deflection means having a first resonance circuit including a horizontal deflection coil and a first capacitor connected in series;
- a flyback transformer connected to said first resonance circuit;
- a second resonance circuit connected to said first resonance circuit in series, which has a modulating coil and second capacitor connected in series;
- a voltage regulating means connected to said flyback transformer which controls a voltage supplied to a first winding of said flyback transformer according to output voltage of a second winding of said flyback transformer for keeping said output voltage of said second winding of said flyback transformer constant; and
- a horizontal deflection current control means which detects deviation of said voltage supplied to said first capacitor and controls a voltage supplied to said second capacitor according to said detected deviation.

* * * * *